United States Patent [19]

Hermann et al.

[11] Patent Number: 4,994,432

[45] Date of Patent: Feb. 19, 1991

[54] HIGH TEMPERATURE SUPERCONDUCTOR SYSTEM AND PROCESSES FOR MAKING SAME

[75] Inventors: Allen M. Hermann; Zhengzhi Sheng, both of Fayettefille, Ark.

[73] Assignee: University of Arkansas, Fayetteville, Ark.

[21] Appl. No.: 144,114

[22] Filed: Jan. 15, 1988

[51] Int. Cl.$^5$ .................... C01F 11/02; C01G 3/02; C01G 15/00; H01L 39/12

[52] U.S. Cl. ........................... 505/1; 252/521; 423/604; 423/624; 423/635; 501/123; 502/346; 505/783

[58] Field of Search ............. 252/521; 505/1, 809; 502/341, 345, 346; 501/98, 123, 126; 423/604, 624, 635, 593

[56] References Cited

U.S. PATENT DOCUMENTS 4,870,052 9/1989 Engler et al. .................. 252/521
4,880,773 11/1989 Itozaki et al. .................. 505/1

OTHER PUBLICATIONS

Richert et al., *AIP Conf. Proc.*, 165 (*Thin Film Processing and Characterization of High-Temperature Superdonductors*), pp. 277-283, 11/87.
Z. Z. Sheng et al., *Nature*, vol. 332, Mar. 3, 1988, pp. 55-58.
Sheng et al., *Physical Review Letters*, vol. 60, No. 10, Mar. 7, 1988, pp. 937-940.
Sheng et al, *Nature*, vol. 332, Mar. 10, 1988, pp. 138-139.
Waldrop, *Science*, Mar. 11, 1988, p. 1243.
Saito et al., *Physica B & C (Amsterdam)*, 148 (1-3), pp. 336-338, 1987 (abstract only).
K. N. Yang, High Temperature Superconductivity in Rare Earth (R)-Barium Copper Oxides $(RBa_2)Cu_3O_{9-\delta}$, Solid State Communications, vol. 63, No. 6, pp. 515-519 (1987).
J. M. Ferrira, Long-Range Magnetic Ordering in the High-$T_C$ Superconductors $RBa_2Cu_3O_{7-\delta}$(R=Nd, Sm, Gd, Dy, and Er), The American Physical Society, 1988, vol. 37, No. 4.
J. M. Tarascon, Oxygen and Rare-Earth Doping of the 90-K Superconducting Perovskite $YBa_2Cu_3O_{7-x}$, The American Physical Society, 1987, vol. 36, No. 1.
P. H. Hor, Superconductivity Above 90 K in the Square-Planar Compound System $ABa_2Cu_3O_{6+x}$ with A=Y, La, Nd, Sm, Eu, Gd, Ho, Er, and Lu, The American Physical Society, 1987, vol. 58, No. 18.
A. Khurana, Superconductivity Seen Above the Boiling Point of Nitrogen, Physics Today, Apr. 1987.
R. J. Cava, Bulk Superconductivity of 91 K in Single-Phase Oxygen-Deficient Perovskite $Ba_2YCu_3O_{9-\delta}$, The American Physical Society, 1987, vol. 58, No. 16.

*Primary Examiner*—Paul Lieberman
*Assistant Examiner*—Linda D. Skaling
*Attorney, Agent, or Firm*—Hill, Van Santen, Steadman & Simpson

[57] ABSTRACT

A high temperature superconducting system has the general composition Tl-R-X-Y, wherein: R is a Group 2A element; X is a Group 1B element; and Y is a Group 6A element. Preferably, the composition has the following formula Tl-Ba-Cu-O. The high temperature superconductor of the present invention has a transition temperature of about 90 K with the probability of one phase superconducting at a temperature perhaps as high as 270 K. Processes for making the high temperature superconductor are also provided.

7 Claims, 2 Drawing Sheets

HIGH TEMPERATURE SUPERCONDUCTOR SYSTEM AND PROCESSES FOR MAKING SAME

BACKGROUND OF THE INVENTION

The present invention relates to high temperature superconductors and methods of making same.

Recently, there has been much work done on the utilization of ternarY oxides containing rare earth elements, barium, and copper for superconductivity above the temperature of liquid nitrogen To date, these systems typically require four elements: a rare earth; an alkaline earth; copper; and oxygen. Superconductor systems based on rare earth elements have not been entirely satisfactory. The use of rare earth elements in the production of superconductors increases the cost of the resultant superconductors because these rare earth elements are in relatively short supply and are expensive. Furthermore, these systems typically exhibit limited transition temperatures at or below 93 K. Partial substitutions of elements for the member(s) in these systems have not produced significantly higher temperature superconductors Typical high temperature superconductive systems based on rare earth elements also suffer the disadvantage of not being producible in an expedient manner. Therefore, typical methods for producing these high temperature superconductive systems do not provide low cost processing and manufacturability.

Accordingly, there is a need for a new superconductive system and process for making same.

SUMMARY OF THE INVENTION

The present invention provides a new high temperature superconductive system and method of making same.

The new high temperature superconductive system is free of rare earth elements and is unique to date among high temperature superconductive systems. To this end, the present invention provides a high temperature superconductive system containing thallium (Tl) and having the following general formula:

Tl—R—X—Y wherein:
R is a metallic element:
X is a metallic element: and
Y is a non-metallic element.

Preferably: R is an element chosen from Group 2A; X is an element chosen from Group 1B; and Y is an element chosen from Group 6A.

In a preferred embodiment, R is barium (Ba), X is copper (Cu), and Y is oxygen (O).

In a preferred embodiment, the superconductor of the new superconductive system of the present invention has the following approximate stoichiometry:

TlBa$_a$Cu$_b$O$_c$ wherein:

a is greater than 0.2 and less than 5;
b is greater than 0.5 and less than 15; and
c is greater than a+b and less than 2+a+b.

A method of producing the high temperature superconductor of the present invention is also provided. The method of the present invention allows the superconductor to be prepared at temperatures of approximately 850 to about 950° C. in flowing oxygen. Accordingly, the method of the present invention allows the superconductor to be formed at relatively low temperatures.

Furthermore, the method of the present invention allows the superconductor to be produced rapidly, in approximately 30 minutes.

Additional advantages and features of the present invention are described in, and will be apparent from, the detailed description of the presently preferred embodiments and from the drawings.

DETAILED DESCRIPTION OF THE PRESENTLY PREFERRED EMBODIMENTS

Figure 1:
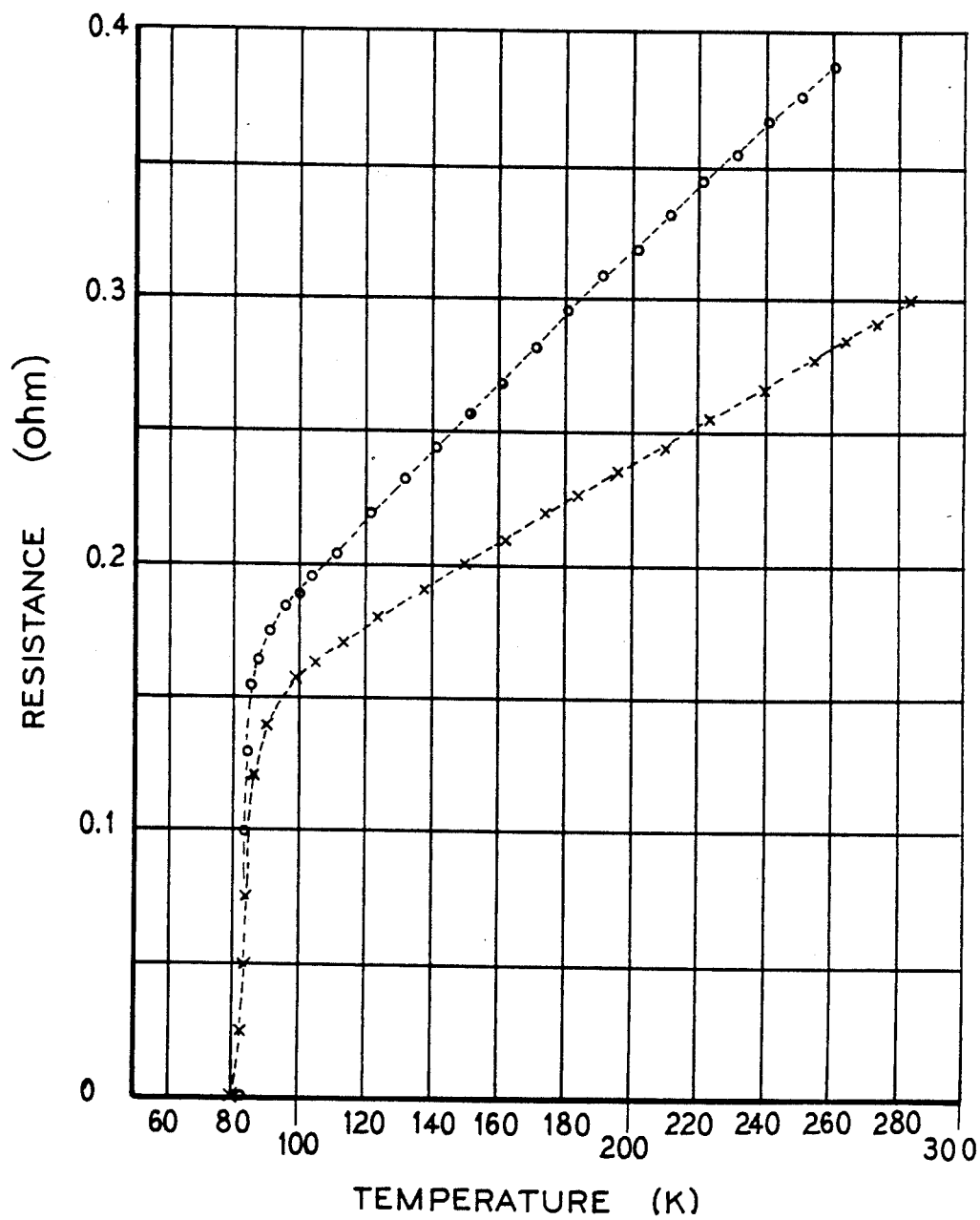
FIG. 1 illustrates variations in the electrical resistance vis-a-vis temperature of two Tl—Ba—Cu—O superconductor samples constructed in accordance with the present invention.

The present invention provides a new high temperature superconductor and method of making same As used herein, the term "high temperature" refers to a temperature above the boiling point of liquid nitrogen. The present invention also provides a new superconductive system that may produce higher temperature, even room temperature, superconductors by further elemental substitution and variation of preparation procedures.

As set forth in the background of the invention, the high temperature superconductors that have been proposed to date require four elements: a rare earth; an alkaline earth; copper; and oxygen. The inventors of the present invention have discovered a superconductive system that does not require the presence of a rare earth element. To this end, the present invention provides a superconductive system based on thallium (Tl). The superconductor constructed in accordance with the present invention is superconducting with a critical temperature of at least 85 K with indications of smaller superconductive phase at 270 K. Furthermore, the inventors have found that the new high temperature superconductor can be rapidly produced at relatively low temperatures.

The superconductor system of the present invention has the following general formula:

Tl—R—X—Y wherein:
R is a metallic element;
X is another metallic element; and
Y is a non-metallic element Preferably, R is an element chosen from Group 2A, X is an element chosen from Group 1B, and Y is an element chosen from Group 6A.

In a preferred embodiment, R is barium (Ba), X is copper (Cu), and Y is oxygen (O).

In a preferred embodiment, a superconductor constructed from the new superconductive system of the present invention has the following approximate stoichiometry:

TlBa$_a$Cu$_b$O$_c$ wherein:
a is greater than 0.2 and less than 5;
b is greater than 0.5 and less than 15; and
c is greater than a+b and less than 2+a+b.

By way of example and not limitation, examples of the new high temperature Tl—Ba—Cu—O superconductor of the present invention, and method of making same, will now be given.

EXAMPLE 1:

A. The following reagents were utilized:
1. $Tl_2O_3$,
2. $BaCO_3$,
3. $CuO$.

B. The following procedure was followed:
1. A mixture of a one molar portion of $BaCO_3$ and a three molar portion of $CuO$ was ground with an agate mortar and pestle, heated in air at approximately 925° C. for more than 24 hours (with several intermediate grindings) to obtain a uniform black powder having the nominal formula $BaCu_3O_4$.
2. The resulting $BaCu_3O_4$ mixed with $Tl_2O_3$ to a molar ratio of 1:0.5. The mixture was completely ground and then pressed into a pellet.
3. A tube furnace was heated to a temperature of approximately 880 to about 900° C. in flowing oxygen.
4. The pellet was then placed in the tube furnace for 2-5 minutes while the temperature and oxygen flow were maintained.
5. After the pellet was slightly melted it was taken out of the furnace and quenched in air until it reached room temperature.

By visual inspection, it was determined that the $Tl_2O_3$ had been partially volatilized as black smoke, part had become a light yellow liquid. and part had reacted with the Ba—Cu oxide to form a partially melted black porous material which is multiphase and superconductive The samples prepared by this procedure had an onset temperature of about 96 K, a midpoint of about 85 K, and a zero resistance temperature of about 81 K.

FIG. 1 illustrates resistance versus temperature dependences down to the boiling point of liquid (77 K) for two samples made pursuant to the procedure of this example. The samples were measured in a simple liquid nitrogen Dewar. Quantitative magnetic examinations of Meissner effect flux expulsion confirmed that the sharp drop of resistance originated from the superconductivity of these samples.

EXAMPLE 2:

A. The following reagents were utilized:
1. $Tl_2O_3$,
2. $BaCO_3$,
3. $CuO$.

B. The following procedure was followed:
1. A mixture of a one molar portion of $BaCO_3$ and a three molar portion of $CuO$ was ground with an agate mortar and pestle. The ground mixture was heated in air at approximately 925° C. for more than 24 hours with several intermediate grindings to obtain a uniform black powder having a nominal composition $BaCu_3O_4$.
2. The resulting BaCu powder was mixed with $Tl_2O_3$ in a molar ratio of 1:1 completely ground and pressed into a pellet.
3. A tube furnace was heated to approximately 950° C. in flowing oxygen.
4. The pellet was then placed in the tube furnace for 2-5 minutes while maintaining the temperature and oxygen flow.
5. After the pellet had completely melted it was taken out of the furnace and quenched in air until it reached room temperature.

Figure 2:
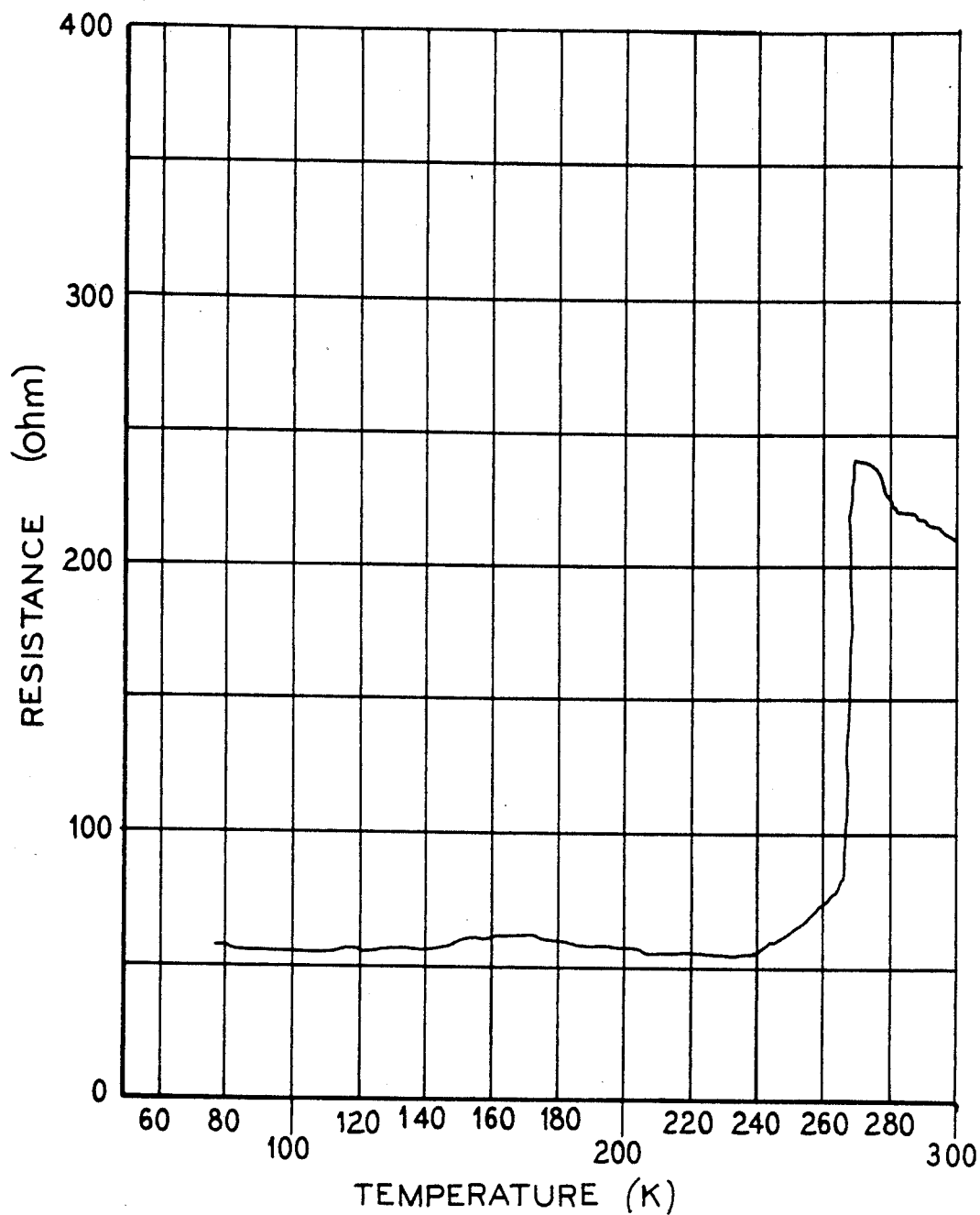
FIG. 2 illustrates the electrical resistance vis-a-vis temperature of a Tl—Ba—Cu—O sample constructed in accordance with the present invention.

The melted sample had visible crystalline grains. FIG. 2 illustrates the electrical resistance versus temperature for a superconductor constructed pursuant to this example. As illustrated, resistance-temperature dependence showed a sharp drop of resistance at about 270 K, which suggests a very high temperature superconducting phase in this sample.

EXAMPLE 3:

A. The following reagents were utilized:
1. $Tl_2O_3$,
2. $BaCO_3$,
3. $CuO$.

B. The following procedure was followed:
1. A mixture of a two molar portion of $BaCO_3$ and a three molar portion of $CuO$ was ground with an agate mortar and pestle, heated in air at approximately 925° C. for more than 24 hours (with several intermediate grindings) to obtain a uniform black powder having the nominal composition $Ba_2Cu_3O_5$.
2. The resultant $Ba_2Cu_3O_5$ powder was mixed with $Tl_2O_3$ to a molar ratio of 1:0.75, completely ground, and pressed into a pellet.
3. A tube furnace was heated to a temperature of approximately 880 to about 900° C. in flowing oxygen.
4. The pellet was placed in the tube furnace for 2-5 minutes while maintaining the temperature and oxygen flow.
5. After the pellet had slightly melted it was taken out of the furnace and quenched in air until it reached room temperature.

The samples prepared by this procedure have been found to be superconductive and have an onset temperature of about 96 K, a midpoint of about 85 K, and a zero resistance temperature of about 81 K.

EXAMPLE 4:

A. The following reagents were utilized:
1. $Tl_2O_3$,
2. $BaCO_3$,
3. $CuO$.

B. The following procedure was followed:
1. Appropriate amounts of $Tl_2O_3$, $BaCO_3$ and $CuO$ with a nominal composition of $TlBaCu_3O_{5.5+x}$ were mixed and pressed into a pellet.
2. A tube furnace was heated to a temperature of approximately 900 to about 950° C. in flowing oxygen.
3. The pellet was placed in the tube furnace for 2-5 minutes while the temperature and oxygen flow were maintained.
4. After the pellet had slightly melted, the pellet was taken out from the furnace and was quenched in air to room temperature.

The heated partially melted sample exhibited superconductive properties. The onset temperature (sharp resistance decrease) for this sample was about 90 K.

EXAMPLE 5:

A. The following reagents were utilized:
1. $Tl_2O_3$,
2. $BaCO_3$,
3. $CuO$. B. The same procedure was followed as set forth in Example 4 above except that the nominal composition of the sample was $Tl_{0.5}BaCu_3O_{4.8+x}$.

The heated (partially melted) sample was superconductive The onset temperature (sharp resistance decrease) for this sample was about 90 K.

EXAMPLE 6:

A. The following reagents were utilized:
1. $Tl_2O_3$,
2. $BaCO_3$,
3. $CuO$.

B. The same procedure was followed as set forth in Example 4 above except that the nominal composition of the sample was $Tl_2BaCu_3O_{7+X}$. The heated (partially melted) sample was superconductive The onset temperature (sharp resistance decrease) for this sample was about 90 K.

EXAMPLE 7:

A. The following reagents were utilized:
1. $Tl_2O_3$,
2. $BaCO_3$,
3. $CuO$.

B. The same procedure was followed as set forth in Example 4 above except that the nominal composition of the sample was $Tl_5BaCu_3O_{11.5+X}$. The heated (partially melted) sample was superconductive The onset temperature (sharp resistance decrease) for this sample was about 90 K.

EXAMPLE 8:

A. The following reagents were utilized:
1. $Tl_2O_3$,
2. $BaCO_3$,
3. $CuO$.

B. The same procedure was followed as set forth in Example 4 above except that the nominal composition of the sample was $TlBa_2Cu_3O_{6.1+X}$. The heated sample had partially melted and was superconductive The onset temperature (sharp resistance decrease) for this sample was about 90 K.

EXAMPLE 9:

A. The following reagents were utilized:
1. $Tl_2O_3$,
2. $BaCO_3$,
3. $CuO$.

B. The following procedure was followed:

1. A mixture of a one molar portion of $BaCO_3$ and a three molar portion of $CuO$ was ground with an agate mortar and pestle, then heated in air at approximately 925° C. for 2 hours, and reground.

2. The resulting $BaCu_3O_4$ powder was put into a quartz boat, and lightly pressed with an agate pestle.

3. $Tl_2O_3$ crystalline powder having approximately half the weight of the $BaCu_3O_4$ was put on the $BaCu_3O_4$, and heated in a tube furnace in air at a temperature of approximately 900 to about 950° C. for about 30 minutes.

4. After almost all of the $Tl_2O_3$ had disappeared (by being volatized, melted and/or reacted), the heated sample was taken from the furnace and quenched in air to room temperature.

By visual inspection, it was determined that the $Tl_2O_3$ had partially volatilized as black smoke, part of the $Tl_2O_3$ had become a light yellow liquid, and part had reacted with Ba-Cu oxide to form a black porous material which is multiphase and superconductive This superconductor material had a transition temperature of 78 K (the transition temperature specified here represents the midpoint of the 90% resistance and 10% resistance points in the transition region)

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A superconductor having the following approximate nominal stoichiometry:

$$TlBa_aCu_bO_c$$

wherein:

a has a value that is equal to or greater than 0.2 and less than 5;

b has a value that is greater than 0.5 and less than 15; and c has a value that is greater than a+b and less than 2+a+b.

2. A composition having superconductive properties comprising a heat processed oxide complex having the following nominal formula:

$$Tl_2Ba_aCu_bO_{c+x}$$

wherein $0.5 \leq Z \leq 5$;

$a=1$;

$b=3$;

$c=1.5z+a+b$; and $-1.5z<x<0.5z$

3. A composition having superconductive properties comprising a heat processed oxide complex having the following approximate nominal stoichiometry:

$$TlBaCu_3O_{5.5+x}$$

wherein:

$-1.5<x<0.5$.

4. A composition having superconductive properties comprising a heat processed oxide complex having the following approximate nominal stoichiometry:

$$Tl_{0.5}BaCu_3O_{4.8+x}$$

wherein:

$-0.8<x<0.3$.

5. A composition having superconductive properties comprising a heat processed oxide complex having the following approximate nominal stoichiometry:

$$Tl_{22}BaCu_3O_{7+x}$$

wherein:

$3.0<x<1.0$.

6. A composition having superconductive properties comprising a heat processed oxide complex having the following approximate nominal stoichiometry:

$$Tl_5BaCu_3lO_{11.5+x}$$

wherein:

$-7.5 < x 0.5.$

7. A composition having superconductive properties comprising a heat processed oxide complex having the following approximate nominal stoichiometry:

$$TlBa_2Cu_3O_{6.5+x}$$

wherein:
$-1.5 < x < 0.5.$

* * * * *

UNITED STATES PATENT AND TRADEMARK OFFICE
CERTIFICATE OF CORRECTION

PATENT NO. : 4,994,432

DATED : February 19, 1991

INVENTOR(S) : Allen M. Hermann, et al.

It is certified that error appears in the above-identified patent and that said Letters Patent is hereby corrected as shown below:

Title page:

Item (19) inventors, should read--Sheng et al.

Item (75) should read-- Zhengzhi Sheng, Allen M Hermann--.

Signed and Sealed this

Second Day of June, 1992

Attest:

DOUGLAS B. COMER

*Attesting Officer*    Acting Commissioner of Patents and Trademarks